United States Patent
Kimura

(10) Patent No.: US 6,782,023 B2
(45) Date of Patent: Aug. 24, 2004

(54) SEMICONDUCTOR LASER

(75) Inventor: Takashi Kimura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/805,102

(22) Filed: Mar. 14, 2001

(65) Prior Publication Data

US 2001/0022795 A1 Sep. 20, 2001

(30) Foreign Application Priority Data

Mar. 15, 2000 (JP) ........................................ 2000-071934
Mar. 23, 2000 (JP) ........................................ 2000-082104

(51) Int. Cl.⁷ ................................................. H01S 5/00
(52) U.S. Cl. ........................................ 372/46; 372/45
(58) Field of Search ............................. 372/45, 46, 43; 257/79, 103, 615

(56) References Cited

U.S. PATENT DOCUMENTS 5,933,443 A * 8/1999 Mushiage et al. ............. 372/46
5,949,809 A * 9/1999 Ashida ........................ 372/46
6,055,255 A * 4/2000 Suyama et al. ............... 372/46

* cited by examiner

Primary Examiner—Jerome Jackson
Assistant Examiner—Joseph Nguyen
(74) Attorney, Agent, or Firm—Arent Fox PLLC

(57) ABSTRACT

The invention has such a double hetero structure (11) that an active layer (3) is sandwiched by an n-type clad layer (2) and a p-type clad layer (4) on a semiconductor substrate (1) made of GaAs. In the p-type clad layer (4), for example, an n-type current constriction layer (6) consisting of at least two layers is provided in such a configuration that a first layer (6a) thereof closer to the active layer is made of a material having almost the same refractive index as the p-type clad layer and a second layer (6b) thereof farther from the active layer is made of a material having a smaller refractive index than the first layer (6a). By this configuration, a self-excitement type and high-power semiconductor laser can be obtained which operates in a stable manner up to a high power without generating a kink while being self-excited at a low power. Another embodiment of the invention comprises a current constriction layer having an n-type in which a stripe trench is formed in the p-type clad layer, and a light confinement layer having a smaller refractive index than the p-type clad layer is formed at the current constriction layer facing the active layer, so as to be of a p-type or non-doped type. By this configuration, a semiconductor laser can be obtained which operates up to a high power without generating a kink.

5 Claims, 3 Drawing Sheets

SEMICONDUCTOR LASER

FIELD OF THE INVENTION

The present invention relates to a semiconductor laser used as a light source for an optical disk device such as a CD-ROM, a CD-R, or a DVD-ROM, a high-definition laser beam printer (LBP), a laser pointer, or the like. More specifically, it relates to such a semiconductor laser that can oscillate at a high power without generating a kink by constricting a current by use of the current constriction layer as well as confining the light as much as possible, or that can oscillate at a high power without generating a kink while being self-excited at a low power by confining the light as well to some extent.

BACKGROUND OF THE INVENTION

A self-alignment type semiconductor laser provided with a light confinement effect due to a current constriction layer has such a construction as shown in FIG. 4 as an example. That is, as shown in FIG. 4, on a substrate 21 made of, e.g., an n-type GaAs are sequentially grown epitaxially an n-type clad layer 22 made of, e.g., n-type $Al_{0.6}Ga_{0.4}As$, an active layer 23 made of non-doped $Al_{0.2}Ga_{0.8}As$, a p-type first clad layer 24a made of p-type $Al_{0.6}Ga_{0.4}As$, an etching stopping layer 25, a current constriction layer 26 made of, e.g., n-type $Al_{0.7}Ga_{0.3}As$, a p-type second clad layer 24b made of p-type $Al_{0.6}Ga_{0.4}As$, and a p-type contact layer 27 made of GaAs, on the top surface of which is formed a p side electrode 28 and on the back surface of the GaAs substrate 21 is formed an n side electrode 29, so that the resultant wafer is subdivided into chips by cleavage or the like to thereby form a semiconductor laser (LD) chip having a construction shown in FIG. 4.

This construction employs, to use the laser for write-in operations or the like, a method for disposing the current constriction layer near the active layer or enlarge the mixed-crystal ratio of Al in the current constriction layer to provide an effective difference in refractive index in order to enhance the light confinement effect, thus oscillating a laser at a high power.

Also, to use the laser for read-out operations or the like, such a method is required to be employed that the noise is reduced at a low power and, for self excitement, the mixed-crystal ratio of Al in the current constriction layer is reduced or the current constriction layer is disposed distant from the active layer to thereby relax the light confinement effect in order to spread the light, thus enabling forming a supersaturating absorption layer outside a current implanting region in the active layer.

As mentioned above, in order to enhance the light confinement effects and oscillate a laser at a high power, the current constriction layer must be disposed near the active layer as much as possible or the mixed-crystal ratio of Al in the current constriction layer made of an AlGaAs-based compound semiconductor must be enlarged to thereby reduce the refractive index. If the mixed-crystal ratio of Al is enlarged, however, the exposed surface of the current constriction layer after a stripe trench is formed therein easily corrodes because Al is very easily oxidized, thus suffering from a problem that a clean mono-crystal semiconductor layer cannot easily be grown when a semiconductor layer is grown again. Although by, in particular, forming beforehand a protective layer such as made of GaAs on the top-most surface of the current constriction layer, thermal etching can be carried out before the re-growing, thus providing a clean layer, the side walls of the stripe trench cannot be cleaned in such a way, so that the semiconductor layer is liable to be poly-crystallized to thereby flow a leakage current and so increase the threshold current value, thus leading to a problem of an increased electric resistance due to poly-crystallization and also a rise in the operation current.

Since the current constriction layer, on the other hand, has a conductivity type different from that of its surrounding clad layer to thereby prevent a current flow by the reverse-biased pn junction, the pn-junction portion has a depletion layer formed thereon due to the reverse biasing, so that as shown in FIG. 5, if the current constriction layer 26 is formed too close to the active layer 23, the depletion layer (refer to C in FIG. 5) reaches the active layer 23. If the depletion layer C reaches to the active layer 23, as shown in FIG. 5, a current I flows to the portion of the current constriction layer 26 where no stripe trench is formed to disable from constricting the current, thus leading to a problem that the invalid current flows through the active layer.

Although to use a laser for both write-in and read-out operations, on the other hand, the laser must oscillate at a high power without generating a kink while being self-excited at a low power to thereby reduce the noise, as mentioned above, there is a trade-off relationship between self-excitement at a low power and obtaining a high power and, therefore, both requirements cannot be satisfied at the same time, so that a self-excitement type semiconductor laser, which has a large fluctuation in power, suffers from a phenomenon called a kink that the power drops during the process of increasing the operation current, leading to a problem of difficulty in obtaining of a high power. A semiconductor laser for obtaining a high power, on the other hand, cannot be self-excited, leading to a problem that the noise cannot be suppressed.

In view of the above, it is an object of the invention to provide a self-excitement type, high-power semiconductor laser that can operate in a stable manner even at a high power without generating a kink while being self-excited at a low power.

It is another object of the invention to provide a high-power semiconductor laser which can operates in a stable manner even at a high power with no kink generated without enlarging so much the mixed-crystal ratio of Al in the current constriction layer and also with preventing a depletion layer due to a pn junction of the current constriction layer from reaching the active layer.

SUMMARY OF THE INVENTION

A semiconductor laser according to the invention comprises an active layer sandwiched by n-type and p-type clad layers in such a construction that either one of the above-mentioned clad layers is provided with a current constriction layer consisting of at least two layers for current confinement and light confinement, the first layer of the current constriction layer closer to the above-mentioned active layer has a conductivity type different from that of the clad layer provided with the current constriction layer and being made of a material having almost the same refractive index as that of the clad layer and the second layer of the above-mentioned current constriction layer farther from the active layer being made of a material having a refractive index smaller than that of the first layer.

By this construction, the first layer closer to the active layer has almost the same refractive index as that of the clad layer to thereby eliminate the light confinement effect, thus serving as a layer only for constricting the current. The second layer farther from the active layer, on the other hand, has a smaller refractive index than the first layer and has the light confinement effect. In this case, the light is emitted from the current implanting region constricted by the first layer closer to the active layer and then the second layer confines the light in the light emitting region from which the light was oscillated, so that the light emitting region in which the light is confined becomes larger than the region to which a carrier is implanted to emit the light thereby permitting thus enlarged portion of the active layer to act as an supersaturating absorption layer. Accordingly, the light can be confined in an enhanced manner while reserving that supersaturating absorption layer, to sufficiently confine the light during self-excitement by use of the supersaturating absorption layer, thus obtaining a high power without generating a kink. Note here that the second layer does not have to be different in conductivity type from the surrounding clad layer but may have the same conductivity type if the first layer can confine the current sufficiently.

In the event that, for example, AlGaAs based compound semiconductor for emitting the infrared light or InGaAlP based compound semiconductor for emitting the red light forms a double hetero construction in which the active layer is sandwiched by n-type and p-type clad layers having a larger band gap than the active layer, the first layer of the current constriction layer is made of a material having almost the same composition as that of the clad layer of the AlGaAs based or InGaALP based compound semiconductor, and the second layer is made of a material having an enlarged mixed-crystal ratio of Al to thereby provide an enlarged difference in refractive index, so that the larger the mixed-crystal ratio of Al or the closer to the active layer, the more the layer has the light confinement effect.

It is preferably that the first and second layers are so formed as to function mainly as a current confinement layer and a light confinement layer respectively and also the stripe trench provided to the first layer is so formed as to be smaller in width than that provided to the second layer, because the supersaturating absorption layer can be reserved securely. That is, if the stripe trench is formed not perpendicular to the surface of the semiconductor layer but is formed to have an inclined surface with respect to that, the stripe width of the first layer closer to the active layer is made smaller than that of the second layer. In this case, however, the two stripe trenches may be etched in different patterns to form the first layer narrower than the second layer.

Even if the stripe trenches are formed so as to have an inclined surface with respect to the width direction of the current constriction layer and the inclined surface of the first layer is formed so as to have a smaller inclination angle than that of the second layer, the stripe trench of the first layer has an even smaller width than the second layer, so that the supersaturating absorption layer can be expanded. Here, the inclination angle of the inclined surface refers to an angle θ of the side wall of the stripe trench with respect to the growing surface of the semiconductor layer (see FIG. 1(b)).

The semiconductor laser according to the invention may have another construction that has a double hetero structure in which the active layer is sandwiched by n-type and p-type clad layers and either one of these clad layers is provided with a current constriction layer with a stripe trench having a different conductivity type from that of this clad layer and also at the current constriction layer on the side of the active layer a light confinement layer having s smaller refractive index than this clad layer is formed without doping or is formed so as to have the same conductivity type as this clad layer.

By this construction, the light confinement layer having a smaller refractive index is formed without doping or so as to have the same conductivity type as the clad layer, so that the only the light confinement effect can be obtained without forming a reverse-biased pn junction. Accordingly, the light confinement layer can be disposed close to the active layer unlimitedly. On the side of that light confinement layer opposite to the active layer, on the other hand, a current constriction layer having a different conductivity type from that of the clad layer is provided to thereby inhibit a current by the reverse-biased pn junction. A depletion region due to this reverse biasing would spread to the light confinement layer but can be controlled not to reach the active layer by adjusting the thickness of the light confinement layer, thus preventing a leakage current from flowing therethrough. As a result, it is possible to enhance the light confinement effect while sufficiently preventing the leakage current from flowing, thus providing stable operations up to a high power.

If the current constriction layer is formed of a semiconductor layer having the same refractive index as the light confinement layer, it is possible for this light confinement layer, even if it is thin, to prevent a depletion layer due to the reverse biasing from reaching the active layer while sufficiently confining the light together with the current constriction layer.

DETAILED DESCRIPTION

Figure 1:
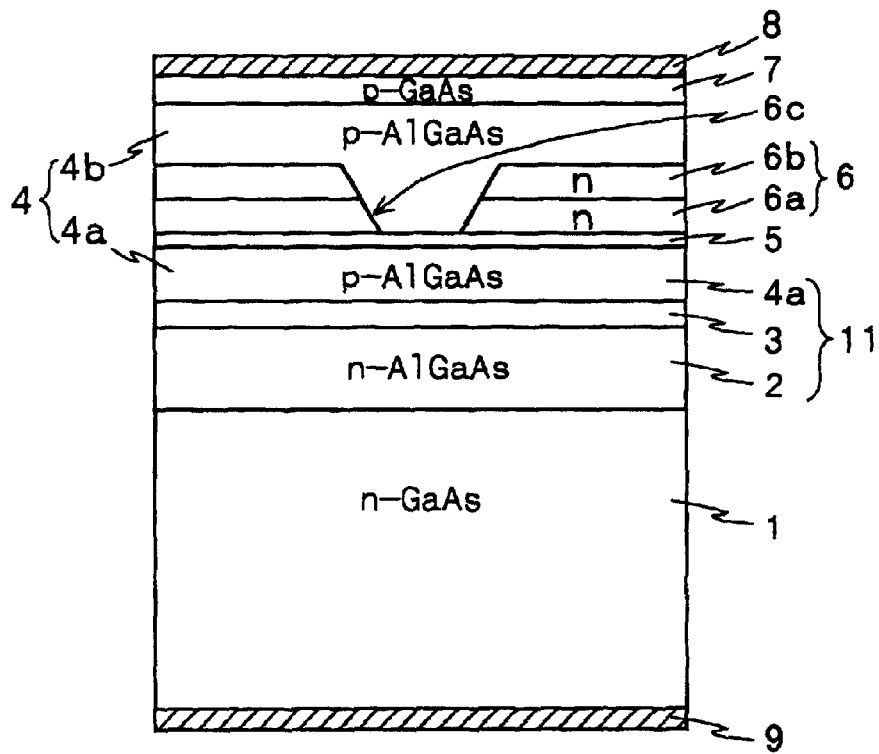
FIGS. 1(a) to 1(b) are cross-sectional views explaining one embodiment of a semiconductor laser according to the present invention.
Figure 1:
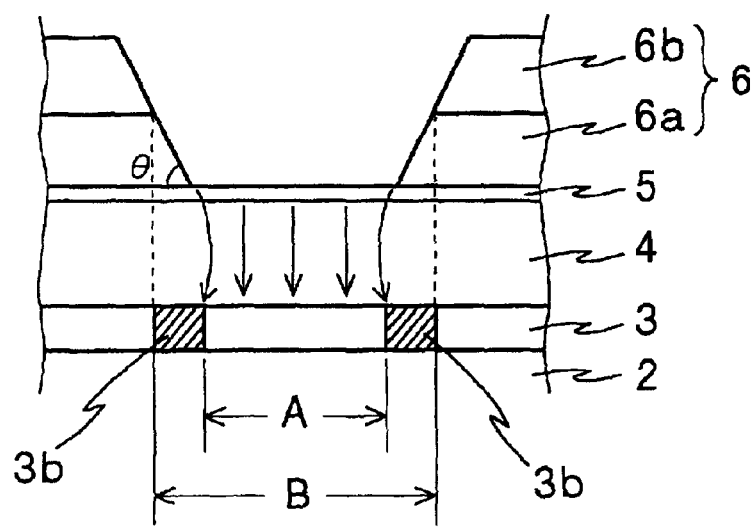

The following will describe embodiments of a semiconductor laser according to the present invention with reference to the drawings. As shown in a cross-sectional view of one embodiment thereof in FIGS. 1(a) and 1(b), the semiconductor laser according to the present invention has such a double hetero structure 11 on a semiconductor substrate 1 made of, e.g., n-type GaAs that an active layer 3 is sandwiched by n-type and p-type clad layers 2 and 4. Further, for example, the p-type clad layer 4 is provided with a current constriction layer 6 consisting of at least two layers having a conductivity type (e.g., n-type) different from the conductivity type (e.g., p-type) of this clad layer 4, in such a configuration that a first layer 6a of the current constriction layer 6 which layer is closer the active layer 3 is made of a material having almost the same refractive index as that of the p-type clad layer 4 and a second layer 6b of the current constriction layer 6 which layer is farther from the active layer 3 is made of a material having a smaller refractive index than the first layer 6a.

In such a case as shown in FIG. 1(a), the double hetero structure 11 has such a stacked-layer configuration that comprises the n-type clad layer 2 made of, e.g. n-type $Al_xGa_{1-x}As$ ($0.3 \leq x \leq 0.8$, e.g. x=0.6), the active layer 3 made of non-doped, n-type, or p-type $Al_yGa_{1-y}As$ ($0 \leq y \leq 0.3$, e.g. y=0.15), and a p-type first clad layer 4a made of p-type $Al_xGa_{1-x}As$. Specifically, in order to determine the material of the active layer 3 based on a band gap corresponding to a desired light emission wavelength to confine a carrier in the active layer 3, this double hetero structure 11 is sandwiched by the clad layers 2 and 4 which have a larger band gap than that material. Therefore, depending on the desired wavelength, in place of an AlGaAs based compound, an InGaAlP based compound or any other semiconductor may be used. Note here that besides being the bulk layer, the active layer 3 may be of a multiple-quantum construction of AlGaAs-AlGaAs (AlGaAs-GaAs) that alternately stacks a well layer made of $Al_{0.1}Ga_{0.9}As$ or GaAs and a barrier layer made of $Al_{0.3}Ga_{0.7}As$.

The p-type clad layer 4 is divided into a first clad layer 4a and a second clad layer 4b with the current constriction layer 6 formed therebetween via the etching stop layer 5. The etching stop layer 5 is provided for stopping further etching when a stripe trench 6c is formed in the current constriction layer 6 and only needs to be formed by such a composition as to enable local etching of the current constriction layer 6, e.g. a non-doped or p-type composition of $Al_aGa_{1-a}As$ ($0 \leq a \leq 1$, $a \neq z$, r) or $InGa_{1-b}Al_bP$ ($0 \leq b \leq 0.5$).

The current constriction layer 6 is divided into a first layer 6a made of, e.g. n-type $Al_zGa_{1-z}As$ ($0.3 \leq z \leq 0.8$, z is nearly equal to x) and a second layer 6b made of $Al_rga_{1-r}As$ ($0.4 \leq r \leq 1$, x<r, z<r), with the stripe trench 6c formed through both layers (which trench appears to be extending perpendicular to the paper surface because the figure shows a cross-sectional view in a direction perpendicular to the stripe).

This first layer 6a is made of a material having almost the same composition as the p-type clad layer 4 and so has little light confinement effect. However, as can be seen from the fact that it is formed as an n-type layer in the p-type clad layer 4, this first layer 6a has a different conductivity type from the clad layer 4 provided with the current constriction layer 6 and so serves to inhibit a current flow, thus permitting a current to flow only through the portion where the stripe trench 6c is formed. That is, it has an action to narrow a current only to the portion of the stripe trench 6c. The second layer 6b, on the other hand, has a larger mixed-crystal ratio of Al of the AlGaAs based compound than the first layer 6a and is made of a material having a smaller refractive index so as to have a light confinement effect and, at the same time, is formed to be an n-type compound so as to have a current constriction effect in corporation with the first layer 6a. In an example shown in FIG. 1(a), although the second layer 6b is also formed as an n-type layer, the first layer 6a alone can constrict the current if it has a width of about 0.2 µm, in which case the conductivity type of the second layer 6b is not limited.

The current constriction layer 6 is thus comprised of at least two layers in such a configuration that the first layer 6a closer to the active layer 3 only has a current confining effect without confining the light, to permit the second layer 6b to have the light confinement effect. Besides, although the above-mentioned stripe trench 6c can be etched so as to have almost perpendicular side walls of its own by adjusting the etching conditions, the inclination angle θ of the side walls is decreased if the ratio of a hydrogen peroxide component is decreased in, for example, a sulfuric acid-based etching solution, so that as shown in FIG. 1(b), the side walls are formed so as to have an inclined surface with respect to the surface of the stacked semiconductor layers. Accordingly, the width of the stripe trench 6c is formed so as to have a width B in the second layer 6b larger than a width A in the first layer 6a.

On the current constriction layer 6 and also on the etching stop layer 5 exposed through the stripe trench 6c is grown a p-type second clad layer 4b having the same composition as the p-type first clad layer 4a, on which is further provided a contact layer 7 made of p-type GaAs, on the surface of which is provided a p-type electrode 8 and on the back surface of semiconductor substrate 1 is provided an n-type electrode 9, so that the structure can be subdivided into chips by cleavage and the like, thus obtaining a semiconductor laser having the construction shown in FIG. 1. Although in the above-mentioned example the n-type GaAs substrate has been employed, a p-type substrate may also be used to obtain the same results by reversing the conductivity types of all those semiconductor layers and also the current constriction layer may be formed below the active layer.

To manufacture the semiconductor laser shown in FIG. 1(a), first on the semiconductor substrate 1 made of n-type GaAs, by using an MOCVD or MBE method, the n-type clad layer 2 made of n-type $Al_{0.6}Ga_{0.4}As$ with a thickness of about 1 µm, the active layer 3 made of non-doped $Al_{0.15}Ga_{0.85}As$ with a thickness of about 0.1 µm, the first clad layer 4a made of p-type $Al_{0.6}Ga_{0.4}As$ with a thickness of about 0.15 µm, the etching stop layer 5 made of non-doped $In_{0.5}Ga_{0.4}Al_{0.1}P$ with a thickness of about a few tens of nano-meters, the first layer 6a of the current constriction layer 6 made of n-type $Al_{0.6}Ga_{0.4}As$ with a thickness of about 0.3 µm, the second layer 6b of the current constriction layer 6 made of n-type $Al_{0.7}Ga_{0.3}As$ with a thickness of about 0.3 µm, and an oxidation preventing layer made of n-type GaAs (not shown) with a thickness of about 0.03 µm are stacked sequentially.

Next, this device in process is masked with a photo-resist except a formation-reserved portion of the stripe trench 6c and etched with, for example, a sulfuric acid-based solution to form the stripe trench 6c, thus forming the stripe trench 6c. This solution cannot etch $In_{0.5}Ga_{0.4}Al_{0.1}P$, so that etching is stopped at the etching stop layer 5 to prevent the p-type first clad layer 4a from being etched, thus etching only the current constriction layer 6 to a predetermined width. In this case, by decreasing the hydrogen peroxide component of the sulfuric acid-based solution, the side walls of the stripe trench 6c has a smaller inclination angle θ, thus obtaining a moderately inclined surface.

Then, the device in process is put in a reactive vessel such as a MOCVD apparatus again to conduct thermal cleaning to thereby evaporate the oxidation preventing layer made of GaAs (not shown), thus stacking both the p-type second clad layer 4b made of p-type $Al_{0.6}Ga_{0.4}As$ and the contact layer 7 made of p-type GaAs to about 1 µm. Then, the respective p-type and n-type electrodes 8 and 9 are formed by, for example, evaporation and then subdivided into chips, thus obtaining a semiconductor laser chip shown in FIG. 1(a).

According to the present invention, the current constriction layer 6 is, as mentioned above, comprised of at least two layers in such a configuration that the first layer 6a thereof closer to the active layer 3 has only the current confinement effect without confining the light and the second layer 6b thereof acts to confine the light. Accordingly, as shown in an expanded portion of the current constriction layer of FIG. 1(b), a portion A where a carrier is confined in the active layer 3 to thereby emit the light does not agree with a portion B where the light is confined by the second layer 6b of the current constriction layer 6 (which light is actually confined by the second layer 6b as distant from the active layer 3, so that the portion B spreads laterally a little), so that the light confinement region B becomes wider than the other. Accordingly, even if the light is confined in an enhanced manner, a non-overlapping portion 3b of the light confinement region B and the light emitting region A due to the carrier of the active layer 3 is supersaturated, to provide a repetitive region acting as a light emitting and light non-emitting regions alternately during a low-power operation, thus being self-excited. During a high-power operation, on the other hand, it always acts as a light emitting region, to oscillate a light in a stable manner throughout the operation region, thus obtaining a high power without a kink.

Figure 2:
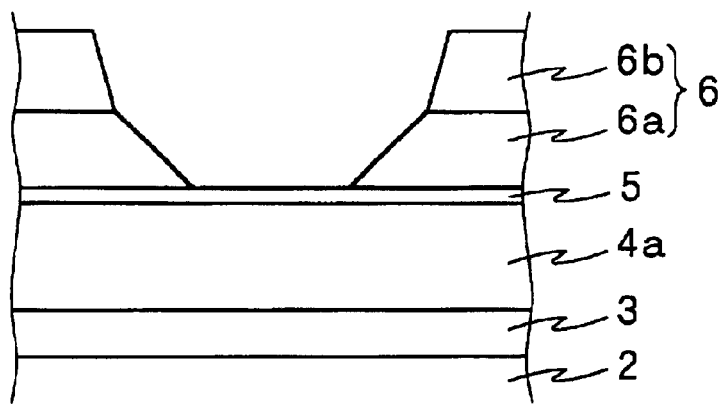
FIG. 2 is a cross-sectional view explaining a variant of the semiconductor laser of FIG. 1.

Although in the above-mentioned example, the side walls of the stripe trench 6c of the current constriction layer 6 has been formed to have almost the same inclination angle through the two layers, as shown in FIG. 2, the etching conditions may be changed to form it with a moderate inclination angle of the first layer 6a and a steep inclination angle of the second layer 6b in order to enlarge the non-overlapping portion of the above-mentioned light emitting region A and light confinement region B, thus increasing the width of the supersaturating absorption layer. As a result, the device can be self-excited easier at a low power, thus enhancing the light confinement effect. Also, although not shown, the first layer 6a and the second layer 6b may be patterned in etching thereof to form the stripe trench 6c, to thereby change the width or, similarly, by making self-excitement easier to occur, the light confinement effect can be enhanced. The other elements in FIG. 2 are not explained here because they are indicated by the same reference numbers as those in FIG. 1(a).

In the self-excitement type semiconductor laser according to the invention using a current constriction layer to have a light confinement effect, current constriction and light confinement operations can be performed separately from each other, so that even if the light is confined in an enhanced manner, an supersaturating absorption layer can be reserved, to thereby satisfy both requirements of self-excitement and a high power operation without a kink. As a result, such a semiconductor laser can be obtained that has low-noise characteristics free the noise due to the return light and also has high-power characteristics.

Figure 3:
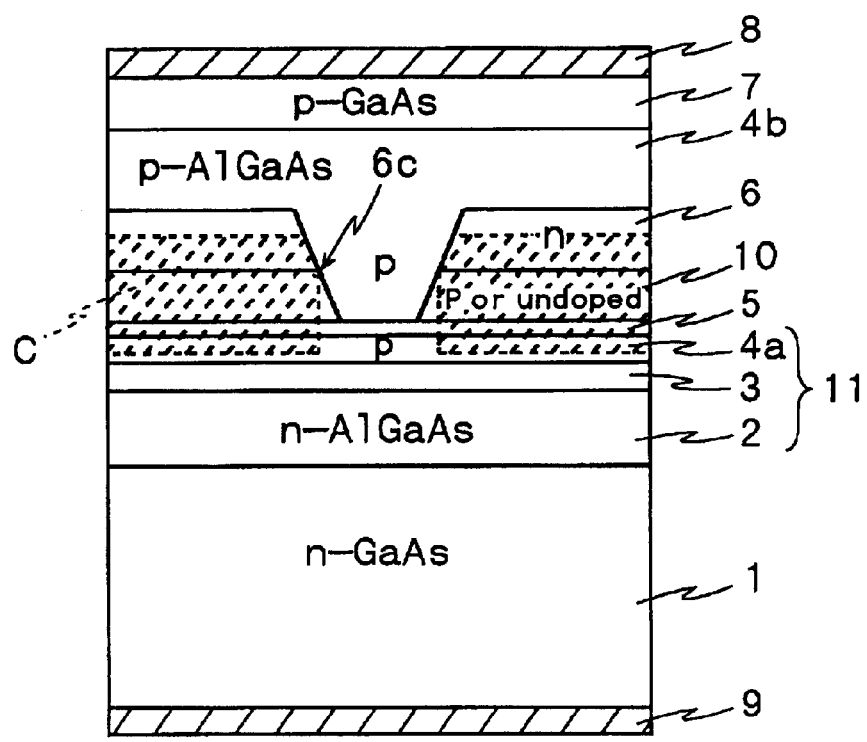
FIG. 3 is a cross-sectional view explaining another embodiment of the semiconductor laser according to the present invention.
Figure 4:
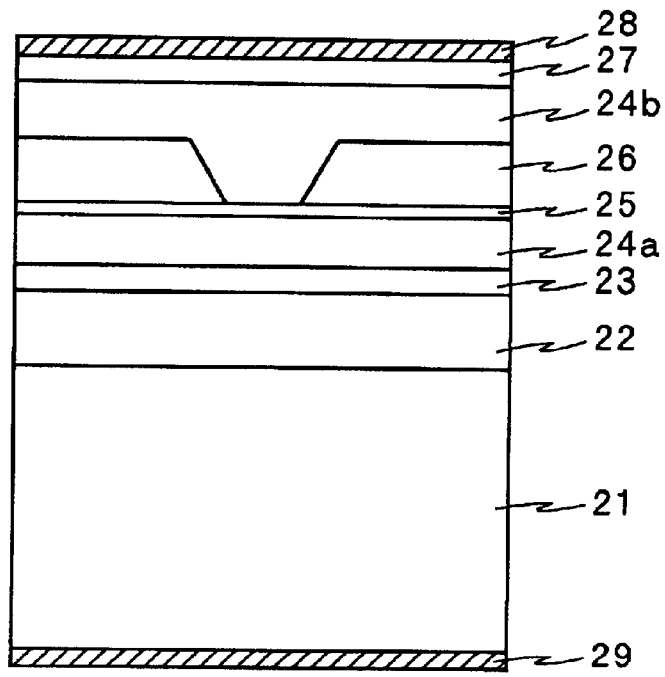
FIG. 4 is a cross-sectional view explaining a conventional self-exciting type semiconductor laser.
Figure 5:
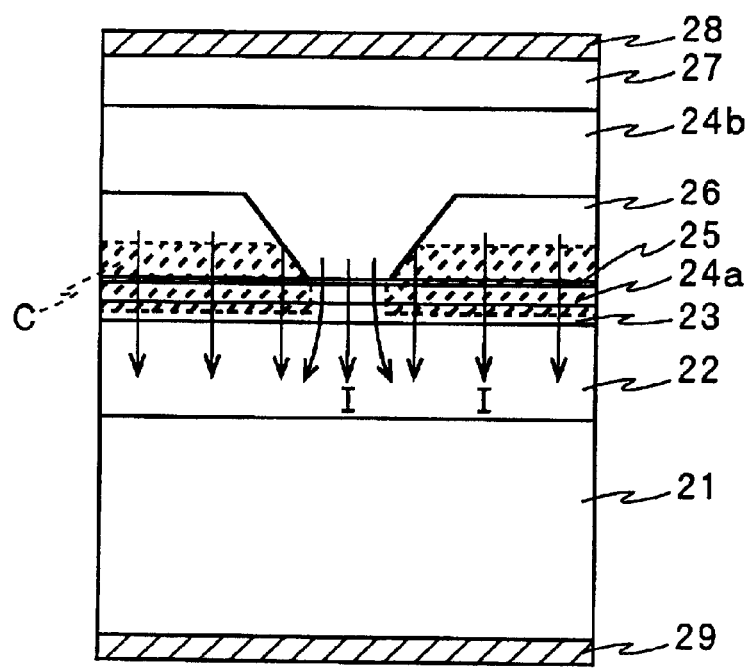
FIG. 5 is a cross-sectional view explaining a problem with a case where a current constriction layer is disposed too close to an active layer in a construction of FIG. 4.

A high-power semiconductor laser according to the present invention comprises, as shown in a cross-sectional view of its embodiment of FIG. 3, has such a double hetero structure 11 that on the semiconductor substrate 1 made of, e.g., n-type GaAs the active layer 3 is sandwiched by n-type and p-type clad layers 2 and 4(4a). In, for example, the p-type clad layer 4 (4a and 4b) is provided the current constriction layer 6 in which the stripe trench 6c is formed which has a different conductivity type (e.g., n-type) from the conductivity type (e.g., p-type) of that clad layer 4, on the active layer 3 side of that current constriction layer 6 is formed a light confinement layer 10 which has a smaller refractive index than the p-type clad layer and also which has the same conductivity type as that p-type clad layer 4 or is non-doped.

The double hetero structure 11 is the same as that of the above-mentioned case shown in FIG. 1(a) except that the current constriction layer does not consists of two layers but comprises the light confinement layer 10 and the current constriction layer 6.

In the case shown in FIG. 3, both the light confinement layer 10 and the current constriction layer 6 are made of $Al_sGa_{1-s}As$ ($0.4 \leq s \leq 0.8$, x<s) and have the stripe trench 6c formed therein (which appears to extend perpendicular to the paper surface because the figure shows the cross-sectional view in a direction perpendicular to the stripe). That is, it is formed to have a larger mixed-crystal ratio s of Al than the clad layer 4 to thereby have a reduced refractive index, thus acting to confine the light to the side of the active layer 3.

On the other hand, the light confinement layer 10 is formed to have the same conductivity type as the surrounding clad layer, i.e. p-type or non-doped type in the case shown in FIG. 3, while the current constriction layer 6 is formed to have the opposite conductivity type, i.e. n-type. Accordingly, at the boundary between this current constriction layer 6 and the light confinement layer 10 is formed a reverse-biased pn junction surface to inhibit a current flow, so that a current flows only through a portion where the stripe trench 6c is formed, thus narrowing the current. If a reverse bias is applied to this pn junction surface, as indicated by a broken line in FIG. 3, the depletion layer C is formed on both sides of the pn junction. The light confinement layer 10 is so formed that this depletion layer C has such a thickness as not to reach the active layer 3. If the light confinement layer 10 is too thick, the current injecting region is liable to spread from the stripe trench, which is not preferable. For example, the light confinement layer 10 is formed to a thickness of about 0.05–0.3 μm and the current constriction layer 6, to a thickness of about 0.2–0.5 μm.

Explanation of the other structures and the manufacturing procedure is omitted here because they are the same as the above-mentioned example shown in FIG. 1(a) and indicated by the same reference numerals.

According to this embodiment, besides the current constriction layer 6, on the side of the active layer, the light confinement layer 10 having a light-confinement action is formed which has a non-doped type or the same conductivity type as the clad layer 4 surrounding that current constriction layer 6 and also which has a smaller refractive index than the clad layer. Accordingly, even if the light confinement layer 10 comes close to the active layer 3, the depletion layer does not break through into the active layer, thus enabling enhancing the light confinement effect due to the proximity to the active layer 3. As a result, without reducing the refractive index by unnecessarily enlarging the mixed-crystal ratio of Al of the current constriction layer 6, the light can be confined sufficiently to improve the crystallinity, thus improving the light emission characteristics including a reduced current value and also enhancing the light confinement effect for stable operations up to a high power.

By this embodiment employing an AlGaAs based compound or InGaAlP based compound semiconductor, in the self-alignment type semiconductor laser which provides a high power by confining the light, since the light confinement layer besides the current constriction layer is formed to have a non-doped type or the same conductivity type as the surrounding clad layer, the light confinement layer can be disposed close to the active layer arbitrarily to enhance the light confinement effect without enhancing it by unnecessarily enlarging the mixed-crystal ratio of Al. As a result, a stable, high-power semiconductor laser can be obtained which does not generate a kink.

Although preferred examples have been described in some detail it is to be understood that certain changes can be made by those skilled in the art without departing from the spirit and scope of the invention as defined by the appended claims.

What is claimed is:

1. A semiconductor laser comprising:

an n-type clad layer;

a p-type clad layer;

an active layer sandwiched by said n-type clad layer and said p-type clad layer; and a current constriction layer for current confinement and light confinement consisting of at least two layers which is disposed in either of said n-type clad layer and said p-type clad layer, wherein a first layer of said current constriction layer closer to said active layer has a different conductivity type from a conductivity type of either of said clad layers in which said current constriction layer is provided and is made of a material having almost the same refractive index as said clad layer, the refractive index of said first layer being smaller than that of said active layer, and wherein a second layer of said current constriction layer farther from said active layer is made of a material having a smaller refractive index than said first layer.

2. The semiconductor laser of claim 1, wherein said first layer of said current constriction layer is formed to function mainly as a current confinement layer and said second layer thereof is formed to function mainly as a light confinement layer and a width of a stripe trench for injecting current provided in said first layer is smaller than a width of a stripe trench provided in said second layer.

3. The semiconductor laser of claim 2, wherein said stripe trench is formed so as to have an inclined surface with respect to a width-direction of said current constriction layer, so that a width of said stripe trench for injecting current provided in said first layer is smaller than a width of said stripe trench provided in said second layer.

4. The semiconductor laser of claim 3, wherein said inclined surface of said first layer has a smaller inclination angle than said second layer.

5. The semiconductor laser of claim 2, wherein said stripe trench in said first layer and said stripe trench in said second layer are provided in different steps, so that the width of said stripe trench provided in said first layer is smaller than the width of said stripe trench provided in said second layer.

* * * * *